United States Patent
Charrier

(10) Patent No.: US 9,503,089 B2
(45) Date of Patent: Nov. 22, 2016

(54) INTEGRATED CIRCUIT HAVING MULTIPLE IDENTIFIED IDENTICAL BLOCKS

(71) Applicant: TRIXELL, Moirans (FR)

(72) Inventor: Laurent Charrier, Moirans (FR)

(73) Assignee: TRIXELL, Moirans (FR)

( * ) Notice: Subject to any disclaimer, the term of this patent is extended or adjusted under 35 U.S.C. 154(b) by 0 days.

(21) Appl. No.: 15/034,415

(22) PCT Filed: Oct. 30, 2014

(86) PCT No.: PCT/EP2014/073383
§ 371 (c)(1),
(2) Date: May 4, 2016

(87) PCT Pub. No.: WO2015/067527
PCT Pub. Date: May 14, 2015

(65) Prior Publication Data
US 2016/0294392 A1    Oct. 6, 2016

(30) Foreign Application Priority Data

Nov. 8, 2013 (FR) ..................... 13 60930

(51) Int. Cl.
| | |
|---|---|
| *G11C 5/02* | (2006.01) |
| *H03K 19/003* | (2006.01) |
| *H03K 19/20* | (2006.01) |
| *H04N 5/378* | (2011.01) |
| *G11C 5/06* | (2006.01) |
| *G11C 7/18* | (2006.01) |
| *G11C 5/04* | (2006.01) |
| G11C 11/4097 | (2006.01) |

(52) U.S. Cl.
CPC ......... *H03K 19/00392* (2013.01); *G11C 5/02* (2013.01); *G11C 5/025* (2013.01); *G11C 5/04* (2013.01); *G11C 5/063* (2013.01); *G11C 7/18* (2013.01); *H03K 19/20* (2013.01); *H04N 5/378* (2013.01); *G11C 11/4097* (2013.01)

(58) Field of Classification Search
CPC ......... G11C 5/025; G11C 5/04; G11C 5/063; G11C 7/18; G11C 11/4097
USPC .......................................... 365/51
See application file for complete search history.

(56) References Cited

U.S. PATENT DOCUMENTS

| | | | | |
|---|---|---|---|---|
| RE40,188 E | * | 3/2008 | Lofstrom | H01L 23/544 324/750.15 |
| 7,928,762 B1 | | 4/2011 | Harris et al. | |
| 8,437,163 B2 | * | 5/2013 | Nakanishi | G11C 5/02 365/189.09 |
| 8,671,386 B2 | * | 3/2014 | Ishii | G06F 8/34 716/139 |
| 2005/0152192 A1 | * | 7/2005 | Boldy | G11B 20/12 365/189.05 |

(Continued)

*Primary Examiner* — Pho M Luu
(74) *Attorney, Agent, or Firm* — Baker & Hostetler LLP

(57) ABSTRACT

An integrated circuit comprising N adjacent identical blocks indexed by index j, a current block connected to preceding and following blocks, each comprising identification circuits comprises: N ordered inputs indexed i, connected to N outputs of the preceding block of same index; and N ordered outputs indexed i, connected to N inputs of the following block of same index; each input for i≠N of the current block connected by routing line indexed to output i+1 of the current block; last input N of the current block not connected to output of the current block; and first output 1 of the current block not connected to input of the current block; each block comprising: a connection pad; and N logic gates indexed i, each gate comprising first and second inputs and an output, N buses indexed i comprising a line through N blocks, and connected to output of a logic gate.

14 Claims, 10 Drawing Sheets

(56) References Cited

U.S. PATENT DOCUMENTS

2006/0202937 A1 9/2006 Chen et al.
2008/0012121 A1 1/2008 Hara
2011/0194326 A1 8/2011 Nakanishi et al.

* cited by examiner

INTEGRATED CIRCUIT HAVING MULTIPLE IDENTIFIED IDENTICAL BLOCKS

CROSS-REFERENCE TO RELATED APPLICATIONS

This application is a National Stage of International patent application PCT/EP2014/073383, filed on Oct. 30, 2014, which claims priority to foreign French patent application No. FR 1360930, filed on Nov. 8, 2013, the disclosures of which are incorporated by reference in their entirety.

FIELD OF THE INVENTION

The present invention relates to the field of integrated circuits produced from a pattern repeated a plurality of times while providing an overlap so that the electrical lines can be connected from one pattern to another. These patterns are said to be stitched.

The present invention is applicable in any type of stitched circuit, such as imagers, displays or detectors, or memory circuits.

BACKGROUND

Integrated circuits are generally produced from single-crystal silicon, polysilicon or amorphous silicon wafers using a photolithography process. This process uses a mask through which light intended to expose a layer of photosensitive material (photoresist) deposited on the wafer is passed. Following this lithography step, the wafer is then etched to remove material, forming a three-dimensional pattern on the surface of the circuit. The exposure/etching process is carried out a number of times to generate the patterns of the various constituent layers of the circuit.

Certain circuits are larger in size than the size of the mask of the photolithography apparatus (stepper). Specifically, the masks or reticles used in present-day lithography processes are about a few centimeters by a few centimeters in size, whereas certain imager circuits have a large area, for example larger than or equal to 100 cm$^2$.

When the circuit comprises identical elements (typically a matrix-array structure, for example imagers, displays or sensors, or memories), one solution is to divide the circuit into identical blocks, which are produced from a single mask shifted a number of times in one or two directions. This process is called "field stitching" or just "stitching". In other words, the circuit is formed from a number of exposures of a semiconductor wafer through one or more masks. Each of the exposures allows a multitude of elements of the circuit, for example several tens, hundreds, or even thousands of pixels in the case of stitching of the matrix-array zone of an image sensor, to be produced.

The various blocks are overlaid so as to ensure an overlap of the electrical connections between blocks.

FIG. 1 describes one exemplary matrix-array "stitched circuit" 101 comprising blocks A, L' and C' each corresponding to a pattern repeated a number of times. In FIG. 1, the blocks are shown separated for the sake of clarity, but in fact they overlap in order to ensure the electrical connections. A matrix-array circuit 101 is for example a display (such as an LCD screen), a detector (such as an x-ray detector) or a memory circuit (such as a flash CMOS memory circuit).

The blocks A are composed of rows, columns and pixels located at the intersection of the rows and columns, which form the actual matrix array. For example a block A may contain 10×10 to 100×100 pixels, the complete matrix array possibly comprising several thousand rows and columns.

The blocks L' and C' comprise circuits for addressing the rows and columns, which circuits are commonly called "drivers".

These blocks are located on the periphery of the matrix array on two perpendicular sides. For example the blocks L' comprise row drivers and the blocks C' column drivers. One block, L' or C', may comprise a plurality of drivers, each driver controlling a plurality of rows or columns. A row driver is configured to process the electrical command signals of a plurality of rows during the addressing of the matrix-array circuit 101, these signals being signals to be injected into the rows or originating from the rows and to be collected to be processed, depending on the type of matrix-array circuit, and likewise for the column drivers. The block D is a physically rectangular corner with no particular function.

Thus, the matrix-array circuit of FIG. 1 is composed of 3×3 blocks A, 3 blocks L' for example addressing the rows and 3 blocks C' for example addressing the columns.

The blocks A, L' and C' are identical to one another by nature, because they are produced from the same pattern, and cannot therefore be distinguished from one another. For certain applications, it may be advantageous to identify the various blocks from one another.

A first simple solution consists in using an additional connection pad to distinguish the blocks from one another. But this solution complexifies the already very dense interconnection of matrix-array circuits comprising many pixels.

On the scale of identification of a pixel, U.S. Pat. No. 7,928,762 describes an identification circuit for each pixel of a given column, the circuit comprising an adder that increments as the rank of the pixel increases in the column. This circuit is based on an active component and thereby has the drawback of needing to be powered.

Furthermore, the column and row drivers receive certain signals that are required to control them, which signals are referred to as functions, via connection pads located on the periphery of the matrix array. Generic functions for all the circuits are for example a CHIP SELECT function (turn-on of the circuit), a POWER DOWN function (low-power mode), the RESET function (reset of a digital portion) and a zoom function. These pads are able to connect the column and row drivers to external circuits.

These functions are generic and used by all the drivers of the identical blocks (L' or C').

The masking technique, which is identical from block to block, necessitates the repetition of the connection pads for each block. Thus, to distribute a function 1 F1 over a dedicated bus running through all the identical blocks, it is necessary to inject this function via one connection pad pad1 per block. According to the prior art, there is therefore, per block, one pad per function, such as illustrated in FIG. 2 for 3 identical blocks L' and 3 functions, function 1 F1, function 2 F2 and function 3 F3, distributed from connection pads pad1, pad2 and pad3, respectively. The drawback is that this method requires many pads.

SUMMARY OF THE INVENTION

The aim of the invention is to remedy the aforementioned drawbacks, by providing a purely passive block identification circuit that routes the functions described above over the associated buses with a smaller number of connection pads.

BRIEF DESCRIPTION OF THE INVENTION DRAWINGS

Other features, aims and advantages of the present invention will become apparent on reading the following detailed description with regard to the appended drawings which are given by way of nonlimiting example and in which:

the aforementioned FIG. 1 describes an exemplary matrix-array stitched circuit;

the aforementioned FIG. 2 illustrates a generic function distribution architecture according to the prior art, each function using one connection pad;

Figure 1:
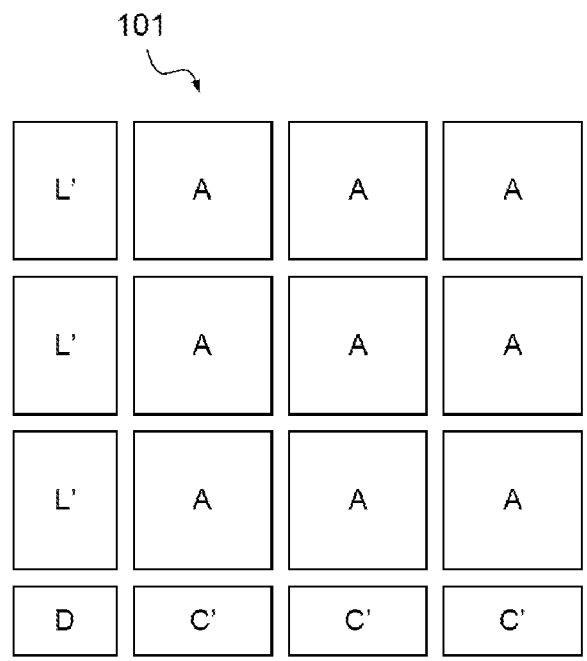
Figure 6:
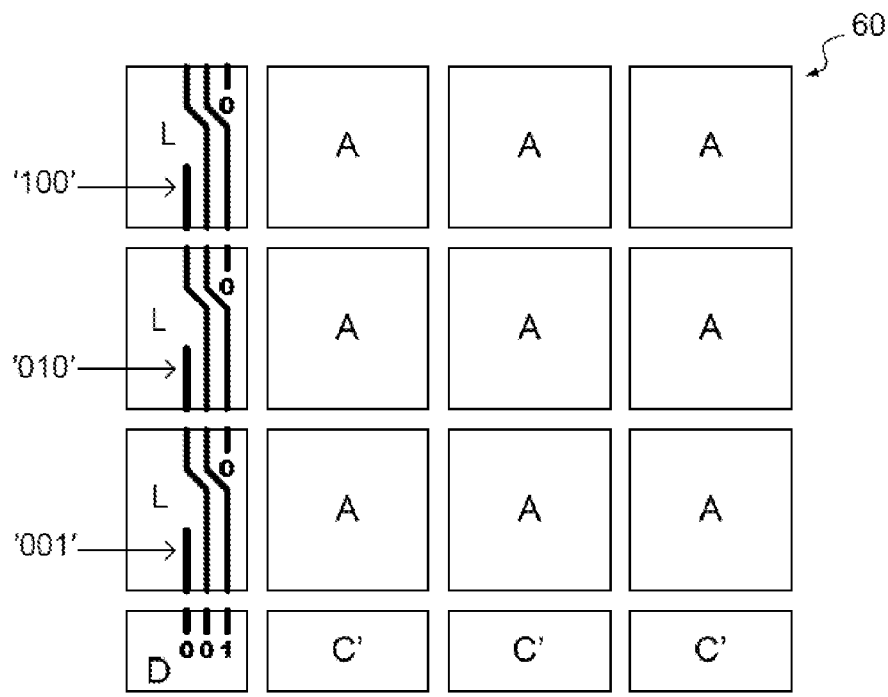
Figure 7:
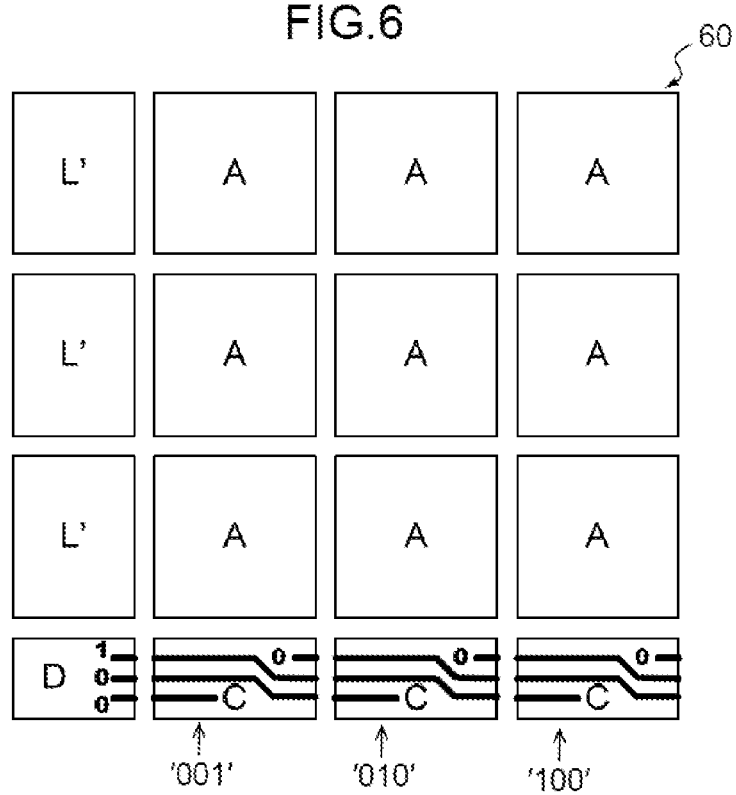
Figure 8:
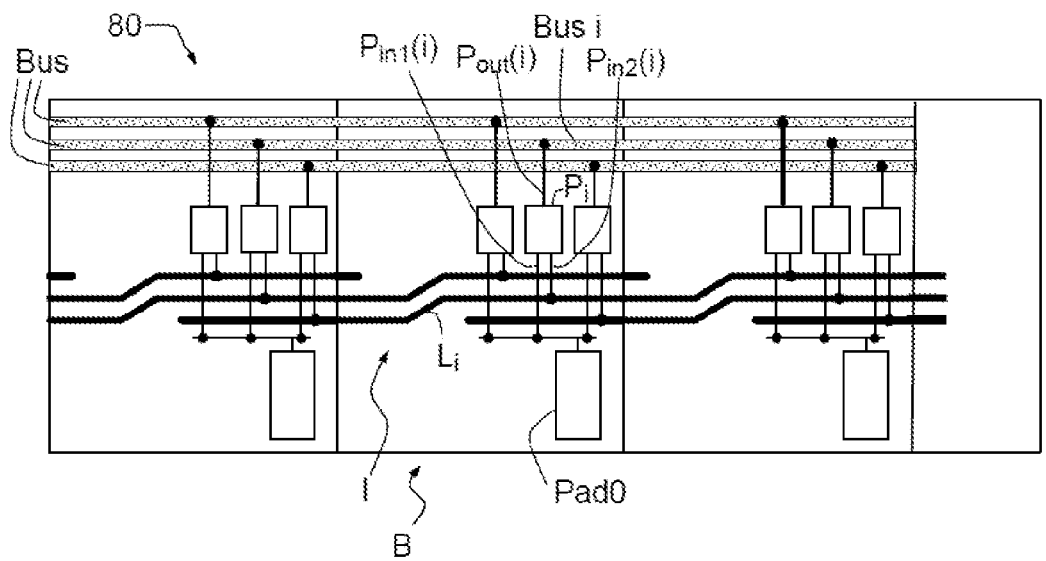
Figure 9:
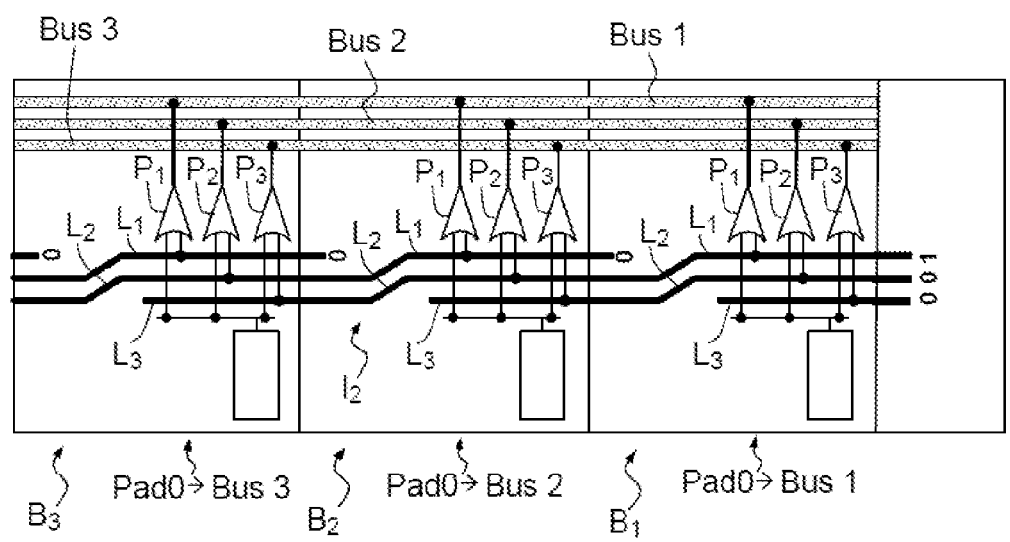
Figure 10:
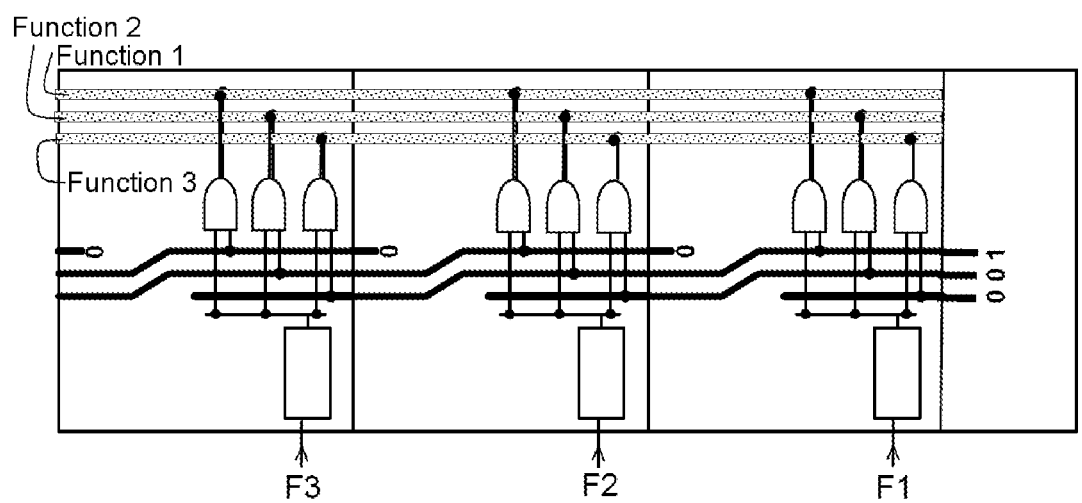
Figure 11:
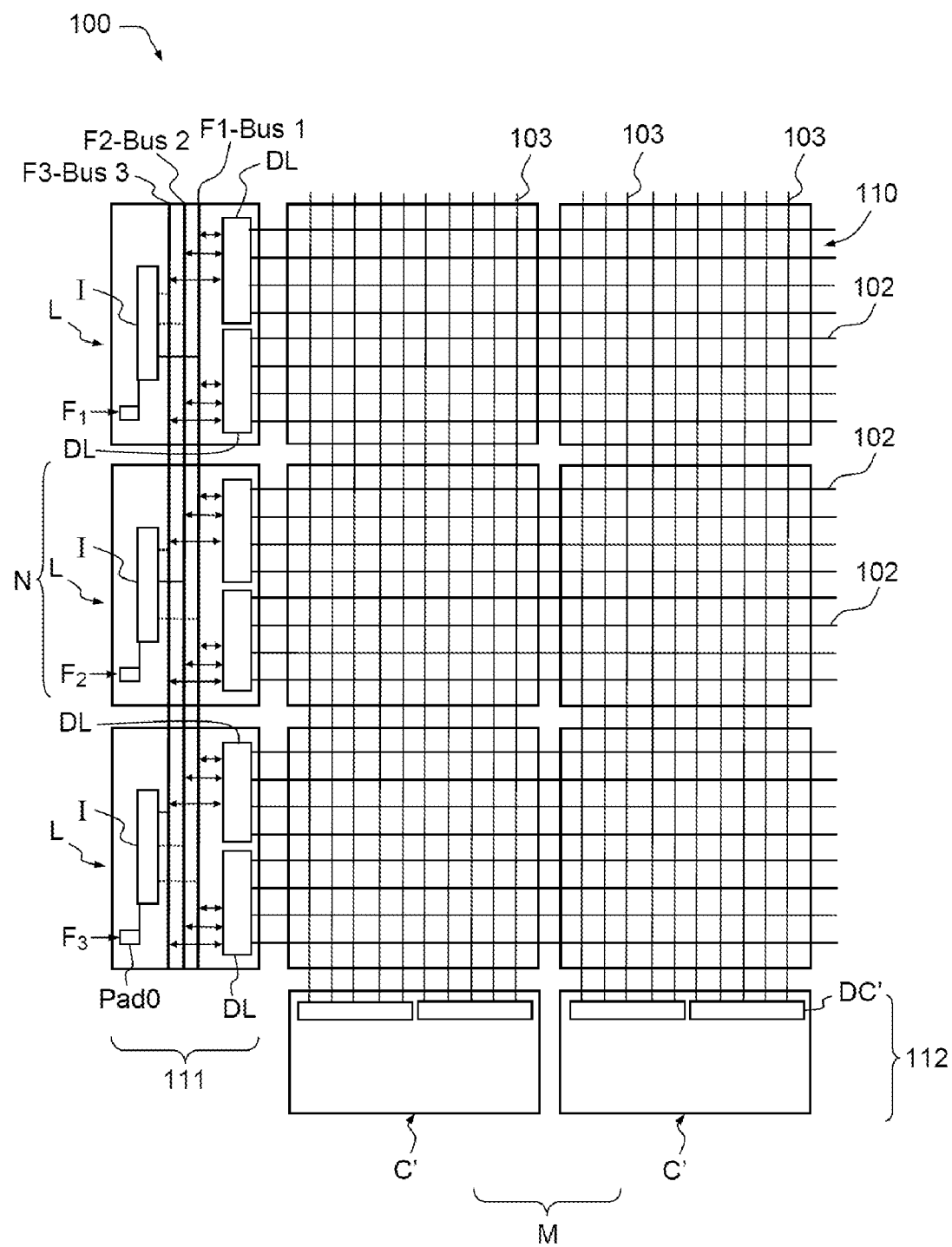
Figure 12:
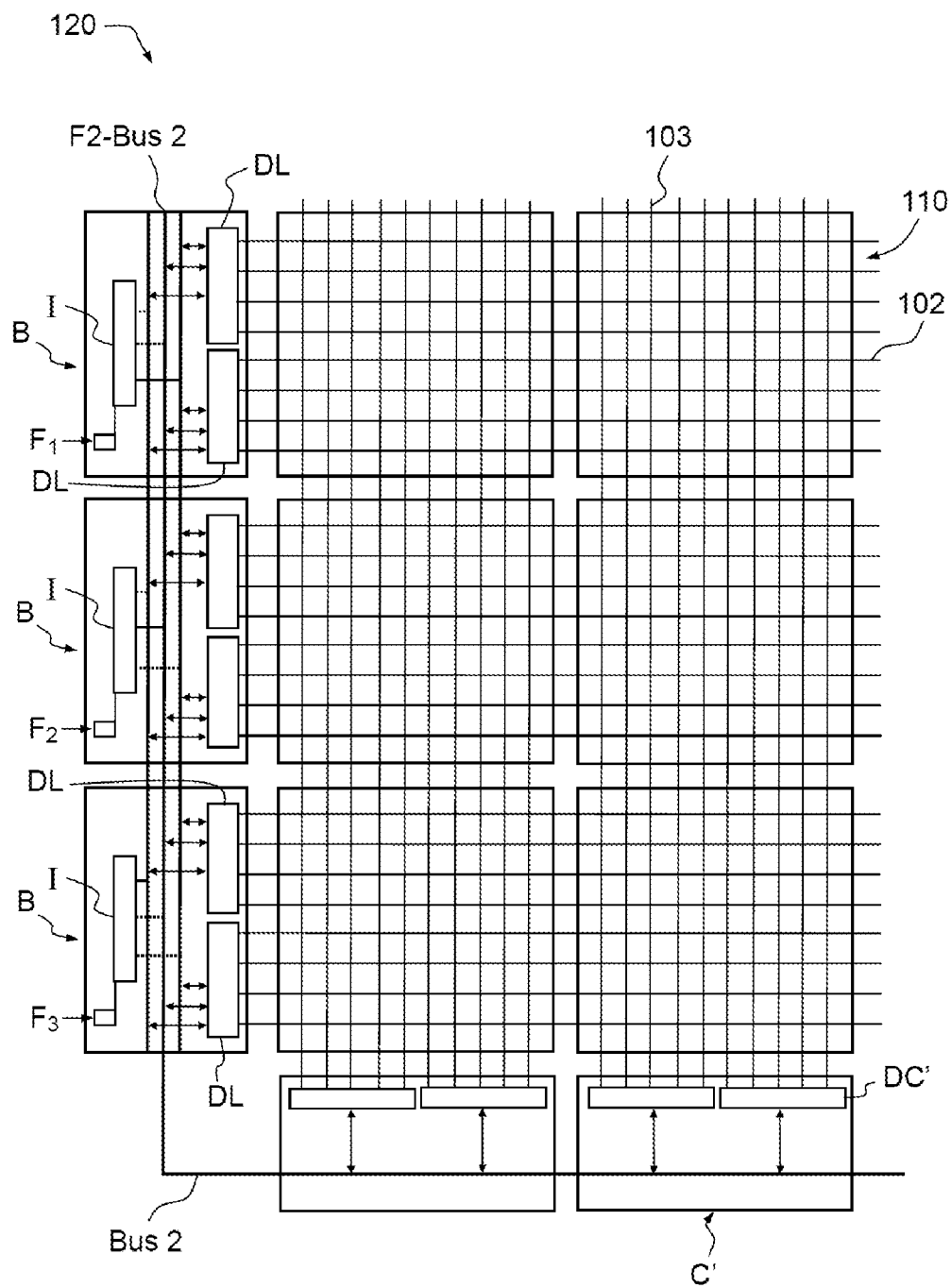
Figure 13:
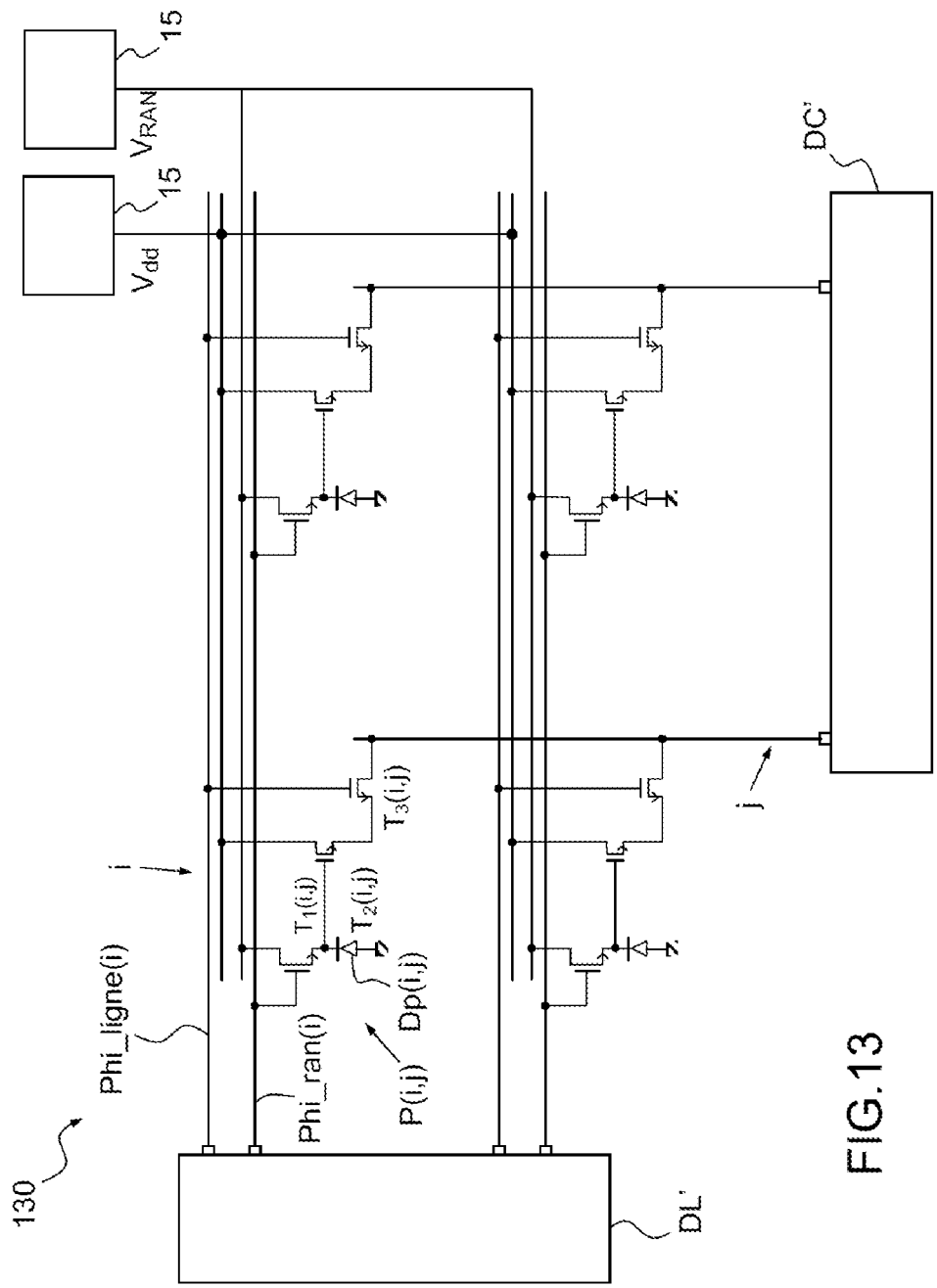
Figure 14:
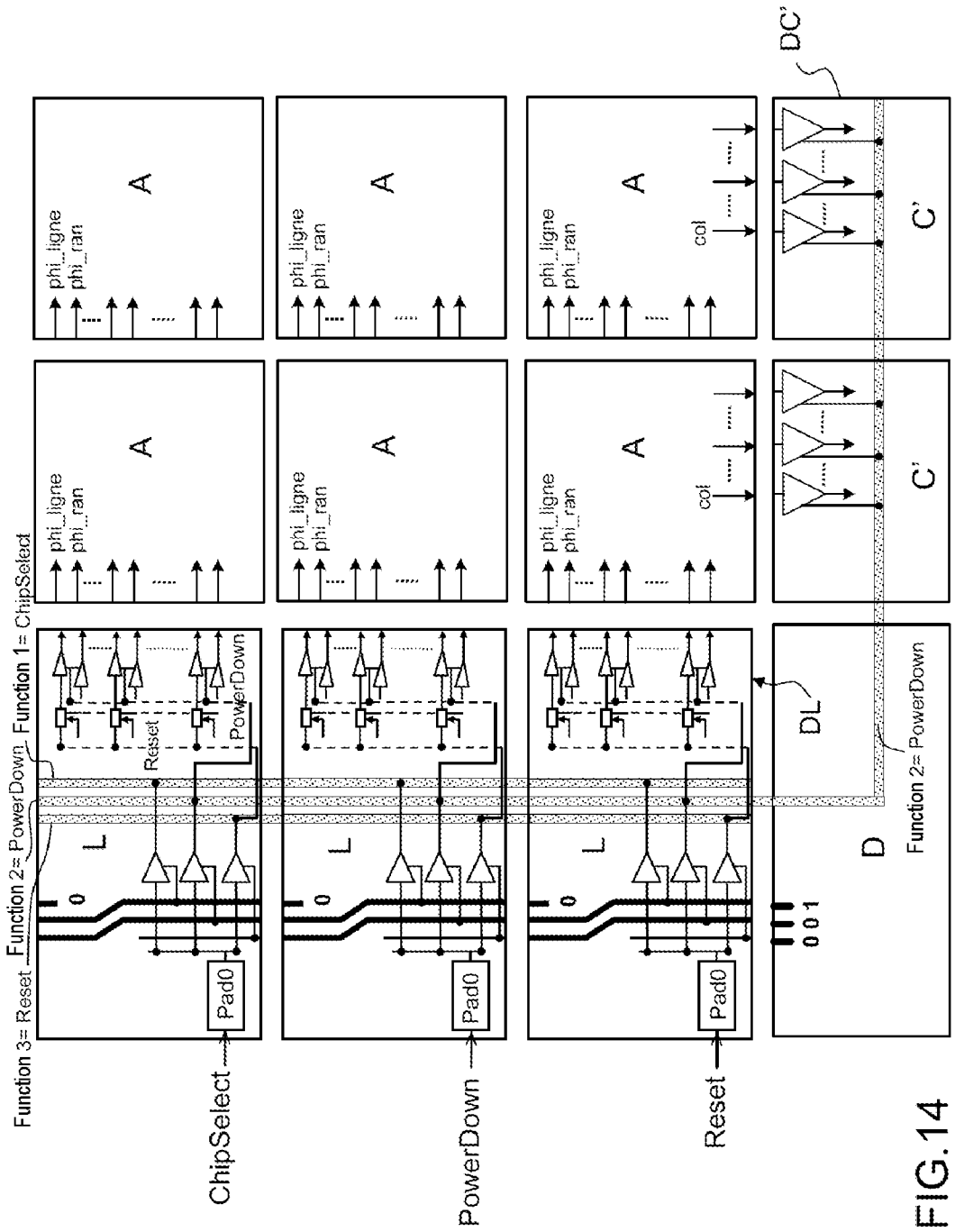

FIG. 6 describes one embodiment in which the identification circuit is associated with identical blocks of type B such as described in FIG. 1, comprising at least one row driver;

FIG. 7 describes another embodiment in which the identification circuit is associated with identical blocks of type C such as described in FIG. 1, comprising at least one column driver;

FIG. 8 illustrates the topology of an integrated circuit according to the invention performing a routing function;

FIG. 9 illustrates one example of operation of the integrated circuit according to the invention FIG. 10 schematically shows the function distribution architecture according to invention;

FIG. 11 illustrates one variant of an integrated circuit according to the invention;

FIG. 12 illustrates another variant of an integrated circuit according to the invention;

FIG. 13 schematically shows four 3T pixels of an image sensor;

FIG. 14 illustrates an image sensor according to the invention; and

Figure 15:
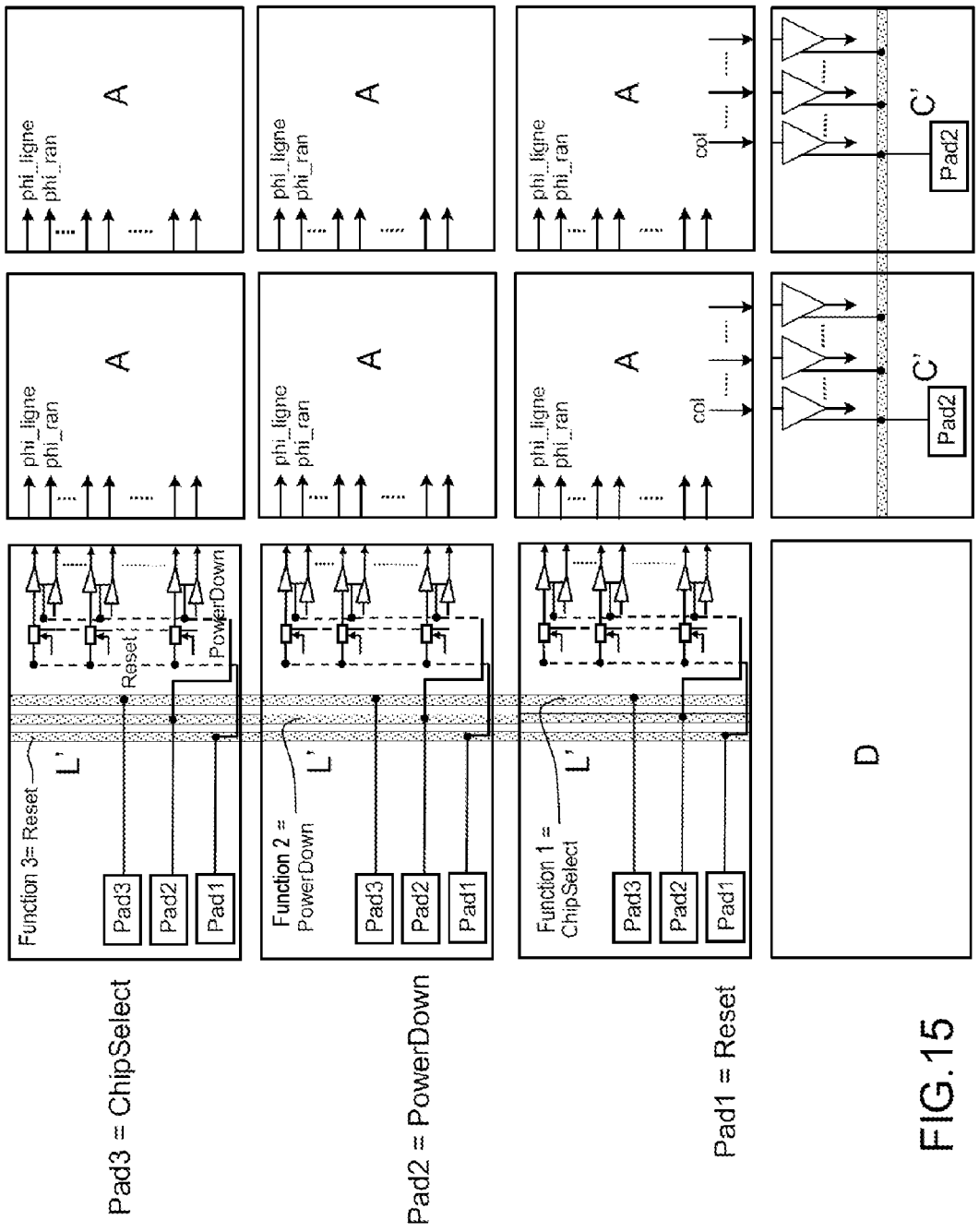

FIG. 15 illustrates an image sensor according to the prior art.

DETAILED DESCRIPTION OF THE INVENTION

Figure 3:
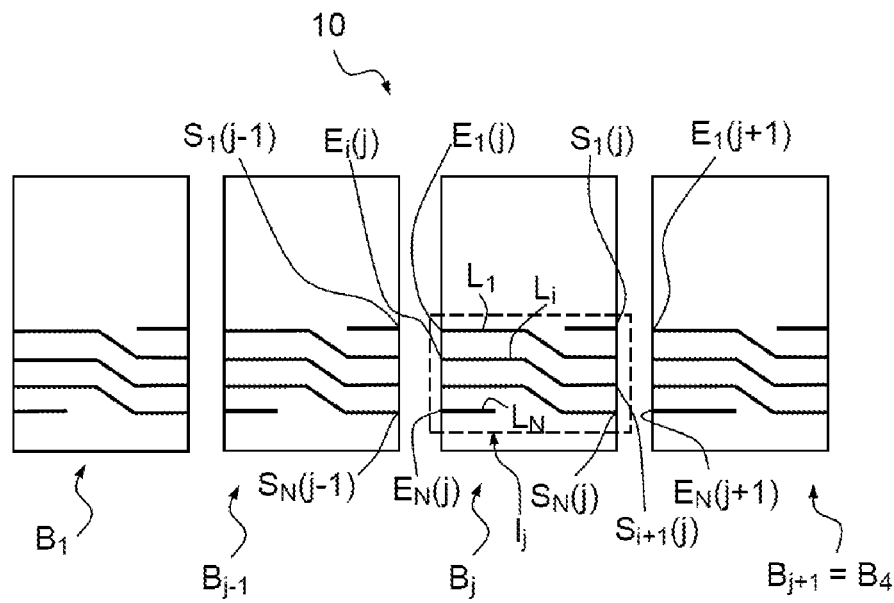
FIG. 3 illustrates an integrated circuit 10 according to the invention.

FIG. 3 illustrates an integrated circuit 10 allowing the invention to be understood. The circuit 10 comprises a plurality of N adjacent identical blocks B indexed by an index j. A current block Bj is electrically connected to a preceding block Bj−1 and to a following block Bj+1. The blocks are schematized separated in FIG. 3 for the clarity of the schematic, but overlap after masking in order to allow the continuity of the lines over the integrated circuit.

Each block comprises an identification circuit Ij intended, according to a first aspect of the invention, to distinguish the identical blocks B from one another. The identification circuit Ij comprises N ordered inputs Ei(j) indexed i, which inputs are connected to the N outputs of the preceding block Bj−1 of same index, which means that the input Ei(j) is electrically connected to the output Si(j−1) by overlap of the blocks. It also comprises N ordered outputs Si(j) indexed i, which outputs are connected to the N inputs of the following block Bj+1 of same index, which means that the output Si(j) is electrically connected to the input Ei(j+1) by overlap of the blocks.

There is electrical continuity between the inputs of the block Bj and the outputs of the block Bj−1 of same index, and between the outputs of the block Bj and the inputs of the block Bj+1 of same index.

Each input i, Ei(j), for i≠N, of the current block Bj is connected by a routing line indexed i, Li, to the output i+1, Si+1(j), of the current block. A last input N, EN(j), of the current block Bj is not connected to any output of the current block, and a first output 1, S1(j), of the current block Bj is not connected to any input of the current block.

By routing line, what is meant is an electrical conductor. The topology of the identification circuit described above is identical for all the blocks, and the routing lines, drawn on the mask pattern, therefore shift by one notch in each block.

FIG. 3 schematically shows the topology of the identification circuit for N=4, but the principle is of course generalizable to any N. For N blocks, there are N routing lines L1, ... Li, ... LN per block, which lines are counted from the input of a block.

The identification circuit is used, in combination with other elements, to achieve routing between at least one connection pad and buses.

FIG. 8 illustrates the topology of an integrated circuit according to the invention. Each block B of the integrated circuit 80 furthermore comprises at least one connection pad Pad0, N logic gates Pi indexed i, each logic gate comprising a first input Pin1($i$), a second input Pin2($i$) and an output Pout(i) and N buses each comprising a line running through all the N blocks, each bus being connected to the output Pout(i) of a single logic gate Pi.

A bus is a conductive line that passes through all the blocks B, said line being intended to convey electrical signals to other circuits from the block B, for example column or row drivers. According to this aspect of the invention, the connection pad Pad0 is coupled to the buses via the identification circuit I and the logic gates Pi in the following way:

all of the first inputs Pin1($i$) of the logic gates Pi are connected to the connection pad Pad0; and each second input Pin2($i$) of a logic gate Pi is connected to a single routing line Li of the identification circuit I.

One advantage of the integrated circuit according to the invention is that the identification is achieved without using active components; no coding or decoding is necessary to distinguish the blocks. Furthermore, the identification remains effective whatever the number of blocks.

Other advantages of the invention are described below.

Figure 4:
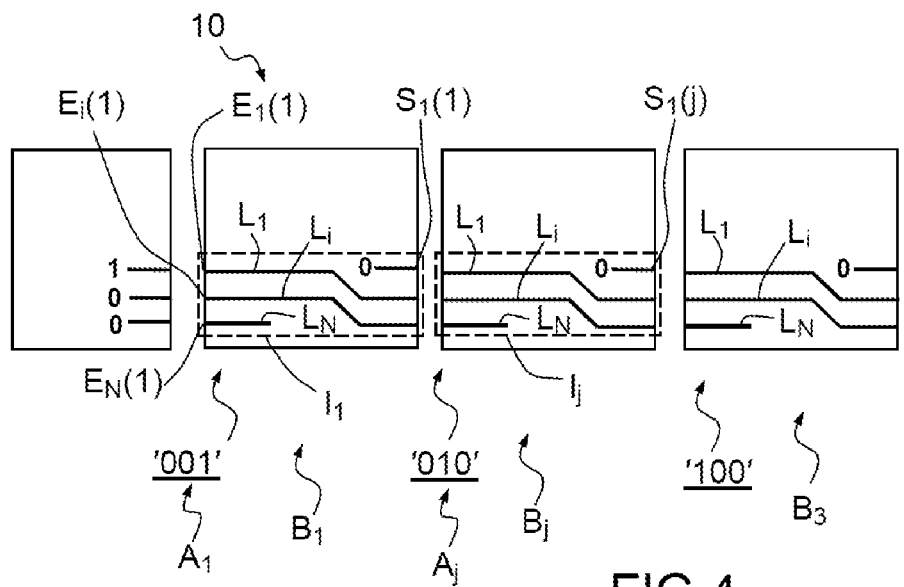
FIG. 4 illustrates one operating mode of the identification circuit Ij of a block Bj.

FIG. 4 illustrates one operating mode of the identification circuit Ij of a block Bj for distinguishing the block indexed j. The identification is achieved from the block B1 indexed 1 located at one end of the plurality of adjacent blocks. The identification circuit I1 of the first block B1 therefore has inputs that are not connected to a preceding block since it is the first link in the chain of blocks. The circuit I1 is such that the first input 1 E1(1) receives a logic level "1", and the inputs i (Ei(1)) for i=2 to N receive a logic level "0". The chain of blocks is thus set.

Furthermore, the first output 1 S1 of the identification circuit of each block (therefore for each and every j), which output is not connected to any input of the block as described above, receives a logic level "0".

By logic level "0", what is meant is a given first state for example corresponding to the application of a voltage of 0 V. By logic level "1", what is meant is a given second state, for example the application of a nonzero voltage.

Because of the shifted topology of the routing lines, the single line having the voltage "1", set to the line L1 for the block B1, shifts a notch in each block until it corresponds to the line LN for the block N. For example the block D sets the line L1 of the first block B1 to the logic level "1", and each block B sets this line L1 to the logic level "0".

The shift makes it possible to distinguish the blocks. Since the other inputs are at "0", it is enough to detect which is the single routing line, from the N routing lines L1 . . . LN of a block, that has the level "1", to distinguish the block. In other words, the ordered sequence Aj of the logic levels of the inputs of each identification circuit Ij of a block Bj thus constitutes a unique identifier of the block, namely an address of this block.

FIG. 4 illustrates the principle for N=3. The address of the block B1 is '001', the address of the block B2 is '010' and the address of the block B3 is '100'.

Figure 5:
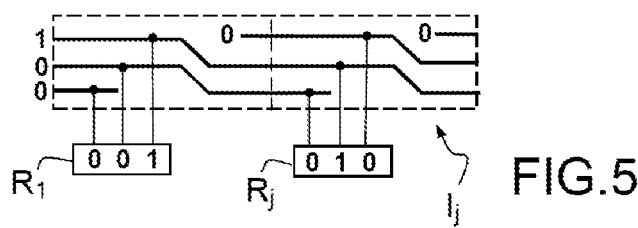
FIG. 5 illustrates an integrated circuit according to the invention comprising a readout circuit Rj associated with each identification circuit Ij of a block Bj.

According to one embodiment illustrated in FIG. 5, the integrated circuit according to the invention comprises a readout circuit Rj associated with each identification circuit Ij, configured to sample the logic level of each input Ei(j), i.e. of each routing line Li, of the identification circuit Ij.

According to one embodiment illustrated in FIG. 6, the identification circuit is associated with identical blocks of type L' such as described in FIG. 1, comprising at least one row driver intended to be associated with a matrix-array circuit 60 of blocks of type A, a row driver being configured for example to process a plurality of signals injected into a plurality of rows. The 3 blocks of type L' according to the invention, denoted blocks L, are thus distinguished using identification circuits comprising 3 routing lines.

According to another embodiment illustrated in FIG. 7, the identification circuit is associated with identical blocks of type C' such as described in FIG. 1, comprising at least one column driver intended to be associated with a matrix-array circuit 60 of blocks of type A, a column driver being configured for example to process a plurality of signals originating from a plurality of columns. The 3 blocks of type C' according to the invention, denoted blocks C, are thus distinguished using identification circuits comprising 3 routing lines.

Of course the two embodiments may be combined.

An example of operation of the circuit 80 according to the invention is illustrated in FIG. 9.

In this example, as in the preceding operating example described in FIG. 4, the routing is set from the block 1 B1 located at one end of the plurality of adjacent blocks Bj. The identification circuit I1 of B1 has a first input E1(1) that receives a logic level "1" and the inputs i Ei(1) for i=2 to N receive a logic level "0".

For each block Bj, the first output 1 S1 of the identification circuit Ij, which is not connected to any input of the block, receives a logic level "0".

Furthermore in this example the N logic gates are "or" gates.

The index of the buses j is arbitrary, it has been chosen to index them by j by convention and to simplify the explanation. What is important is the number N. In the integrated circuit according to the invention there are N adjacent blocks that are topologically identical by nature, each block comprising an identification circuit comprising N routing lines L, and N logic gates P connected to N buses.

The transfer of the voltage "1" from one block to another on the routing lines allows the connection pad pad0 of a block to be connected, via the "or" gate connected to the routing line at "1", to a single bus from the N buses, depending on the position j of the block Bj in the chain of identical blocks. Thus, the identification circuit Ij of a block indexed j Bj performs a routing function connecting the connection pad pad0 to a single bus Busj indexed j.

In the example in FIG. 9, where N=3, the pad0 of block B1 is connected to Bus1 via P1, the pad0 of block B2 is connected to Bus2 via P2, and the pad0 of block B3 is connected to Bus3 via P3.

Figure 2:
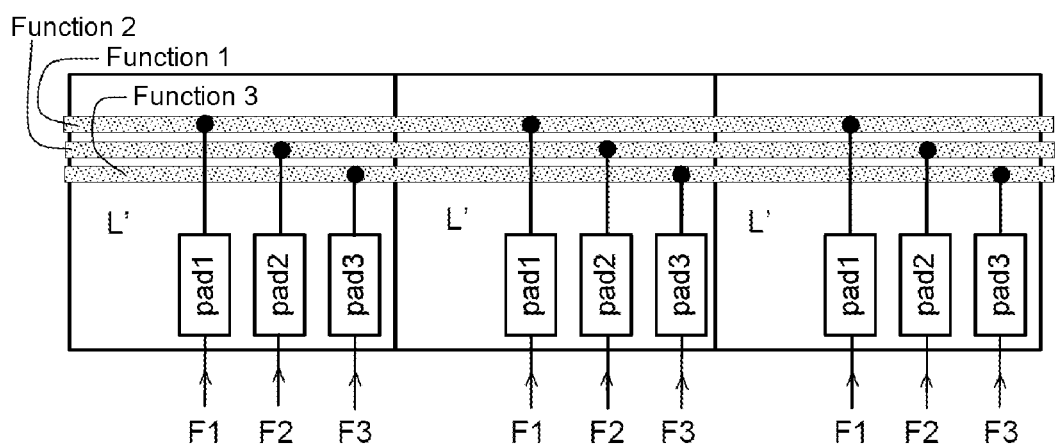

One advantage of the invention relative to the prior art may be seen from FIG. 10, which schematically shows the function distribution architecture according to the invention, when compared to FIG. 2. Because of the distinction of the blocks performing the routing operated by the circuit according to the invention, a single connection pad pad0 is enough to distribute 3 functions F1, F2 and F3 over the associated buses. To do this, it is enough to inject into the pad the function associated with the bus with which the pad is connected. Therefore a particular function is assigned to a connection pad of a block B indexed j by virtue of the routing line connected to "1". In summary, the distinction of the various blocks allows the injection of different functions despite an identical masking pattern.

Thus, one advantage of the circuit according to the invention is to significantly decrease the number of connection pads. In the example where N=3, only 3 pads are necessary instead of 9 as in the prior art.

As explained above, the functions are intended to be shared by a plurality of circuits.

According to one variant illustrated in FIG. 11, each of the N identical blocks of the integrated circuit 111 according to the invention, denoted row blocks L according to the invention, comprises at least one row driver DL intended to be associated with a matrix-array circuit 110 comprising rows 102 and columns 103, a row driver DL being configured to process a plurality of signals injected into a plurality of rows or originating from a plurality of rows.

According to another variant, each of the N identical blocks of the integrated circuit according to the invention, denoted column blocks C according to the invention, comprises at least one column driver DC intended to be associated with a matrix-array circuit 110 comprising rows 102 and columns 103, a column driver DC being configured to process a plurality of signals injected into a plurality of columns or originating from a plurality of columns.

Thus, for the two above variants, the integrated circuit according to the invention comprises at least one connection pad pad0 associated with N generic functions Fi indexed i, these generic functions being distributed to all of the drivers DL (or DC) of the N identical blocks.

Each bus Busi is able to transmit an associated generic function Fi to the driver DL (or DC) of the block, and a generic function Fi is injected at the connection pad of the block connecting the connection pad to the bus Busi associated with the generic function Fi.

Each row or column block comprises at least one driver circuit, and may of course comprise a plurality thereof.

The principle is generalizable to a plurality of connection pads per block, each pad being associated with N functions. For example, if there is a need for 6 functions, for 3 blocks, each block B according to the invention comprises 2 pads pad0 and pad1 to generate the 6 functions.

In this case there are 6 function buses, each bus distributing 1 function. The two pads use the same identifier circuit and each pad 3 associated logic gates, thereby making it possible to obtain 2 times 3 equals 6 different functions.

According to another aspect also illustrated in FIG. 11, the invention relates to an integrated assembly 100 comprising:

an integrated circuit 111 according to the invention comprising N row blocks L;

a matrix-array circuit 110; and an integrated circuit 112 comprising M identical blocks C', each block C' comprising at least one column driver DC', but not comprising an identification circuit according to the invention.

In FIG. 11, N=3 and M=2.

Alternatively, the integrated assembly comprises:

an integrated circuit according to the invention comprising N column blocks C;

a matrix-array circuit 110; and an integrated circuit comprising M identical blocks L', each block L' comprising at least one row driver DL', but not comprising an identification circuit according to the invention.

The matrix-array circuit 110 may be produced from a block A repeated N×M times.

Of course, alternatively, the integrated assembly may comprise both row blocks and column blocks according to the invention. It then comprises:

an integrated circuit according to the invention comprising N row blocks L;

an integrated circuit according to the invention comprising M column blocks C; and a matrix-array circuit 110.

According to another variant illustrated in FIG. 12, the integrated assembly 120 comprises at least one bus, associated with a generic function, which distributes the generic function to the drivers (DC', DL') of the M identical blocks that do not comprise an identification circuit according to the invention.

In the example in FIG. 12, the function F2, distributed to the row drivers by Bus2 via a circuit according to the invention, is also distributed by Bus2 to the column drivers DC'. The bus (Bus2 in the example) thus runs through all the blocks comprising row drivers and all the blocks comprising column drivers, and therefore extends along both sides of the matrix-array circuit 110. Bus2 thus distributes the function 2 to all the row (DL) and column (DL') drivers.

The generic functions F1, F2, F3 according to the invention are for example the functions: "chip select"; "power down" and "reset". These functions are conventional.

The "chip select" function corresponds to a circuit selection, the "power down" function corresponds to placing the circuit in a low consumption mode and the "reset" function corresponds to zeroing of the circuit.

For example, N=3 and the three distributed functions are "chip select", "power down" and "reset".

We will now describe an exemplary implementation of an integrated assembly according to the invention.

The integrated assembly according to the invention for example constitutes a radiation detector, the matrix-array circuit comprising pixels (photosensitive locations) at the intersections of the rows and columns, which pixels are intended to convert the radiation to which they are subjected into an electrical signal. The electrical signal may take the form of a charge, a voltage or a current. These electrical signals originating from the various pixels are collected in a matrix-array readout phase then digitized so as to be able to be processed and stored to form an image.

For example, the pixels are formed from a photosensitive zone delivering a current of electrical charges depending on the flux of photons that said zone receives, and an electronic circuit for processing this current. The photosensitive zone generally comprises a photosensitive element, or photodetector, which may for example be a photodiode, a photoresistor or a phototransistor. Photosensitive matrix arrays of large size, which may possess several million pixels, are known.

The radiation detector may be used for the imaging of ionizing radiation, and especially x- or γ-rays, in the medical field or the field of nondestructive testing in the industrial domain, for detection of radiological images. The photosensitive elements allow electromagnetic radiation in or near the visible to be detected. These elements are not, or not very, sensitive to the radiation incident on the detector. A radiation converter called a scintillator is thus frequently used, which converts the incident radiation, for example an x-ray, into radiation in a range of wavelengths to which the photosensitive elements present in the pixels are sensitive.

FIG. 13 schematically shows 4 pixels of a CMOS image sensor 130, the pixels being what are commonly referred to as 3T pixels. A row is indexed i and a column j, the pixel at the intersection of the row i and the column j is P(i, j).

Each pixel comprises a photosensitive zone here represented by a photodiode D and an electronic processing circuit formed from three transistors T1, T2 and T3. In the figure, the references of the photodiode D and of the three transistors are followed by two coordinates (i,j) possibly taking the rank of the row for i and the rank of the column for j. The pixels of a given row are connected to 4 conductors conveying signals Phi_ligne, Vdd, V_ran and Phi_ran allowing each of the rows of pixels to be controlled. Phi_ligne and phi_ran are managed by the row driver DL' (also referred to as a row addressing circuit), Vdd and V_ran are biasing voltages. The well-known operation of this detector is not detailed here.

FIG. 14 illustrates an exemplary implementation of the invention in this type of detector. The row block L according to the invention allows the three functions "chip select", "power down" and "reset" to be distributed to the row drivers DL via a single connection pad pad0. The power down function is shared with the column drivers DC' of the blocks C' not comprising the invention.

In this example, each pad pad0 controls 3 "buffers" the output of which is high impedance, unless its input from the side is at "1". Because only one line is at "1" per block L, the pad pad0 has a single function per block: "ChipSelect" or "PowerDown" or "Reset". The function "Reset" and its associated signal thus zeroes all the flip-flops of all the blocks L. The function "PowerDown" and its associated signal thus places all the amplifiers of all the blocks L and also of all the blocks C' into a low consumption mode.

FIG. 15 illustrates a detector according to the prior art comprising three connection pads per block for comparison.

According to another embodiment, the integrated assembly according to the invention constitutes a memory circuit, the matrix-array circuit comprising memory locations intended to store information. Memory circuits are circuits for which it is a sought to achieve a maximum size. They include the same selection or amplification functions. Thus the same technique allows the number of pads of the circuit to be decreased while keeping the same functions.

The invention claimed is:

1. An integrated circuit comprising a plurality of N adjacent identical blocks indexed by an index j, a current block being connected to a preceding block and to a following block, each block comprising an identification circuit comprising:

N ordered inputs indexed i, which inputs are connected to the N outputs of the preceding block of same index; and N ordered outputs indexed i, which outputs are connected to the N inputs of the following block of same index;

each input i for i≠N of the current block is connected by a routing line indexed i to the output i+1 of the current block;

a last input N of the current block is not connected to any output of said current block; and a first output 1 of the current block is not connected to any input of said current block;

each block further comprising:
  at least one connection pad; and
  N logic gates indexed i, each logic gate comprising a first input, a second input and an output,
  N buses indexed i each comprising a line running through all the N blocks, each bus being connected to the output of a single logic gate, the connection pad being coupled to the buses via the identification circuit and the logic gates so that:
  all the first inputs of the logic gates are connected to the connection pad,
  each second input of a logic gate is connected to a single routing line of the identification circuit.

2. The integrated circuit as claimed in claim 1, wherein:
the identification circuit of the first block located at one end of the plurality of adjacent blocks is such that:
  the first input 1 receives a logic level "1"; and
  the inputs i for i=2 to N receive a logic level "0";
the first output 1 of the identification circuit of each block, which output is not connected to any input of the block, receives a logic level "0",
so that the ordered sequence of the logic levels of the inputs of each identification circuit of a block constitutes a unique identifier of the block.

3. The integrated circuit as claimed in claim 2, wherein the ordered sequence of the logic levels of the inputs of an identification circuit of a block constitutes an address of the block.

4. The integrated circuit as claimed in claim 2, further comprising a readout circuit associated with each identification circuit, configured to sample the logic level of each input of the identification circuit.

5. The integrated circuit as claimed in claim 1, wherein:
the identification circuit of the first block located at one end of the plurality of adjacent blocks and having a first input not connected to a proceeding block is such that:
  the inputs i for i=2 to N receive a logic level "0"; and
  the first input 1 receives a logic level "1";
the first output 1 of the identification circuit of each block which is not connected to any input of the block receives a logic level "0"; and the N logic gates are "or" gates so that the identification circuit of a block indexed j performs a routing function connecting the connection pad to a single bus indexed j.

6. The integrated circuit as claimed in claim 5, wherein the N identical blocks, which are what are referred to as row blocks, furthermore each comprise at least one row driver intended to be associated with a matrix-array circuit comprising rows and columns, a row driver being configured to process a plurality of signals injected into a plurality of rows or originating from a plurality of rows.

7. The integrated circuit as claimed in claim 5, wherein the N identical blocks, which are what are referred to as column blocks, furthermore each comprise at least one column driver intended to be associated with a matrix-array circuit comprising rows and columns, a driver being configured to process a plurality of signals injected into a plurality of columns or originating from a plurality of columns.

8. The integrated circuit as claimed in claim 6, wherein one connection pad is associated with N generic functions indexed i, said generic functions being distributed to all the control circuits of the N identical blocks,
  each bus being able to transmit an associated generic function to the driver of the block,
  a generic function being injected at the connection pad of the block connecting the connection pad to the bus associated with the generic function.

9. The integrated circuit as claimed in claim 8, comprising a plurality of connection pads, each connection pad being associated with N generic functions.

10. The integrated circuit as claimed in claim 8, wherein the generic functions are chosen from the functions "chip select" and/or "power down" and/or "reset".

11. An integrated assembly comprising an integrated circuit as claimed in claim 6, a matrix-array circuit and a plurality of M identical blocks comprising at least one driver.

12. The integrated assembly as claimed in claim 11, wherein at least one bus associated with a generic function distributes said generic function to the control circuits of the M identical blocks.

13. The integrated assembly as claimed in claim 11, constituting a radiation detector, the matrix-array circuit comprising pixels intended to convert radiation into an electrical signal.

14. The integrated assembly as claimed in claim 11, constituting a memory circuit, the matrix-array circuit comprising memory locations intended to store information.

* * * * *